US012660331B2

(12) United States Patent
Postak et al.

(10) Patent No.: US 12,660,331 B2
(45) Date of Patent: Jun. 16, 2026

(54) EXTERIOR EDGE SEAL FOR A MODULE

(71) Applicant: Quanex IG Systems, Inc., Cambridge, OH (US)

(72) Inventors: Lori Aruscavage Postak, University Heights, OH (US); Mark Christopher Molinaro, Leo, IN (US); Sean Joseph Hummel, Seville, OH (US)

(73) Assignee: Quanex IG Systems, LLC, Cambridge, OH (US)

( * ) Notice: Subject to any disclaimer, the term of this patent is extended or adjusted under 35 U.S.C. 154(b) by 0 days.

(21) Appl. No.: 18/868,001

(22) PCT Filed: May 26, 2023

(86) PCT No.: PCT/US2023/023754
§ 371 (c)(1),
(2) Date: Nov. 21, 2024

(87) PCT Pub. No.: WO2023/230357
PCT Pub. Date: Nov. 30, 2023

(65) Prior Publication Data
US 2025/0169200 A1 May 22, 2025

Related U.S. Application Data

(60) Provisional application No. 63/346,170, filed on May 26, 2022.

(51) Int. Cl.
*H10F 19/80* (2025.01)

(52) U.S. Cl.
CPC .................................. *H10F 19/804* (2025.01)

(58) Field of Classification Search
CPC .............................. H10F 19/80; H10F 19/804
See application file for complete search history.

(56) References Cited

U.S. PATENT DOCUMENTS

2003/0079772 A1* 5/2003 Gittings .................. H10F 19/80
136/251
2012/0017980 A1* 1/2012 Lai .................... B32B 17/10302
156/60
2013/0014821 A1* 1/2013 Cheng .................... H02S 30/10
136/259
2017/0358699 A1* 12/2017 Juliano .................. H10F 19/80

* cited by examiner

*Primary Examiner* — Mayla Gonzalez Ramos
(74) *Attorney, Agent, or Firm* — Fred Zollinger

(57) ABSTRACT

An external edge seal is used at the exterior edges of different modules to decrease the permeation of moisture and reactive gas to lengthen the life span of the modules. The sealed module can be a photovoltaic module, an insulating glass unit, a screen, a dynamic glazing product, a switchable window, an electrochromic window, a thin-film transistor, or other modules using items between substrates. The edge seal includes a desiccated adhesive carried by a barrier film to form a tape. The vapor barrier can be placed along the edge of a sealed module or around the edge and against portions of the outer substrate surfaces of the sealed module to provide a desiccated seal that provides or lengthens the desiccated path that moisture vapor must follow before permeating the inner space of the sealed module.

5 Claims, 5 Drawing Sheets

EXTERIOR EDGE SEAL FOR A MODULE

CROSS REFERENCE TO RELATED APPLICATIONS

This application is a United States National Stage Patent Application filed under 35 U.S.C. § 371 of PCT application PCT/US2023/023754 having an international filing date of 26 May 2023. This application claims priority to and the benefit of United States Provisional Patent Application No. 63/346,170 filed 26 May 2022; the disclosures of which are incorporated herein by reference.

BACKGROUND OF THE DISCLOSURE

1. Technical Field

The disclosure relates to a seal that is used on the exterior of different types of modules to decrease moisture vapor and gas permeation into the module in order to lengthen the life span of the modules. More particularly, the disclosure relates to a desiccated adhesive external edge seal or tape that can be positioned on or around the edge of sealed or unsealed modules to provide or lengthen the desiccated barrier path that limits the permeation of moisture vapor and air. Specifically, the disclosure relates to the use of a desiccated polymer adhesive carried by a barrier film having at least a low moisture vapor transmission rate (MVTR) to seal the edge of a module such as a photovoltaic module.

2. Background Information

Sealed modules that include spaced substrates sealed about their perimeter edges are used for photovoltaic modules, insulating glass units for windows, thin-film transistors, and screens such as organic light-emitting diode (OLED) screens. Sealed modules are also used in dynamic glazing products, switchable windows, and electrochromic windows. The substrates that form the sealed modules can be glass, polymer, metal, or a combination of materials. The sealed inner spaces of these modules are sensitive to the permeation of moisture and oxygen or the loss of a filling gas such as argon in the case of insulating glass units. The life span of the modules is decreased as moisture vapor enters the module, as filling gas escapes, or as a reactive gas such as oxygen enters the module. These sealed modules thus have the requirement in common that the inner space defined between the substrates and the edge seal must be sealed. Particularly, the inner spaces of the different modules need to be sealed against the ingress of moisture vapor and oxygen. As shown in FIG. 1, one solution is to use desiccated internal edge sealants 30 located directly between the substrates 16 and 18 of the module to create a desiccated path for the moisture vapor which allows the desiccant to dramatically reduce the moisture vapor moving through internal edge seal 30 into the inner space or components 19 of the module. A drawback to this solution is that the width of the internal edge seal reduces the area of the substrate available for use by the application of the sealed module. Wide seals are desired for protection against moisture vapor while narrow seals are desired for increased useful surface area of the module.

Photovoltaic (PV) devices convert light energy, especially solar energy, into electrical energy. Photovoltaically generated electrical energy can be used for all the same purposes of electricity generated by batteries or electricity obtained from established electrical power grids, but is a renewable form of electrical energy. Sunlight is the only requirement to produce electricity using a photovoltaic device. Many types of photovoltaic devices include at least one photovoltaic module having a photovoltaically active layer carried on a substrate such as glass, plastic or metal. The photovoltaically active element is covered by another substrate that is substantially light transmissive to allow sunlight to reach the active element. The substrates are referred to as sheets, panes, or layers. The substrates can be substantially rigid or flexible pieces of glass, such as float glass, soda-lime glass or a low iron glass, a durable, strong polymeric material such as a polyimide, or a metal sheet or film such as aluminum, steel, titanium, chromium, iron, and the like.

Photovoltaic module manufacturers use various techniques to slow the introduction of moisture vapor into a photovoltaic module and to protect the active layer from moisture. Moisture inside of a photovoltaic module can lead to several issues impacting the performance of the module. These include but are not limited to loss of efficiency, corrosion, and loss of function. One technique to slow the entry of moisture vapor is to encapsulate the active element. Another technique is to apply a desiccated butyl perimeter edge seal inside the perimeter edge between the two substrates. An edge seal can be used with both rigid and flexible substrates. The perimeter edge seal delays the presence of moisture in the module. Another technique is to apply a sealant to a frame and then embed the module in the sealant such that the sealant flows around the module. This method is ineffective at keeping moisture out of the module interior. Embedding in silicone sealant is easy but silicone sealant is highly permeable to moisture. Hot melt butyl sealant is less permeable but cools quickly so forming a good bond and barrier is difficult, and the path into the module can be short circuited. Hot melt butyl also does not contain desiccant necessary to achieve the necessary effective permeability rate for at least 25 years of durability.

Insulating glass units typically include glass substrates, sheets, panes, or layers spaced apart by an internal perimeter spacer that defines an inner chamber between the substrates. The inner chamber can be filled with an inert gas such as argon. The internal spacer provides enough structural support to space the substrates and some types include desiccant to minimize the entrance of moisture vapor into the inner chamber.

Some video screens also use sealed modules with an active layer positioned between substrates. These can be used in small screens such as on watches and handheld computers as well as in large video displays. One type is an OLED screen that can be configured for use in a small device such as a watch or a handheld computer (phone or gaming device) to large video displays (flat screen television or other video display). An OLED device typically includes one or more organic light emitting layer(s) disposed between electrodes. For example, first and second contacts, such as a cathode and a light transmissive anode are formed on a substrate. Light is emitted when current is applied across the cathode and anode. As photons of light are generated and emitted, the photons move through the organic layer. Those that move toward the cathode, which generally comprises a metal, may be reflected back into the organic layer. Those photons that move through the organic layer to the light transmissive anode, and finally to the substrate, however, may be emitted from the OLED in the form of light energy. The OLED devices can be mounted on a rigid substrate such as glass or are generally flexible, i.e., are capable of being bent into a shape having a radius of curvature. Oxygen and moisture are particularly deleterious to an OLED structure.

The intrusion of oxygen or moisture into the OLED device results in dark spots, decreased illumination, etc. It is important, therefore, to create a hermetic seal around the OLED panel to minimize the potential for ingress of oxygen and moisture. A particular area of concern is along the perimeter edge of the OLED device or panel where laminate edges of adjacent layers of the structure of the OLED device are potentially exposed and possibly subject to oxygen and/or moisture ingress. When an internal perimeter seal is used, the seal must be compatible with the organic light emitting layer(s) and the electrodes.

Other sealed module applications include dynamic glazing products, switchable windows, electrochromic windows, and thin-film transistors. These and other sealed modules benefit from an improved edge seal.

SUMMARY OF THE DISCLOSURE

The disclosure provides an external edge seal that is used on or around the exterior edges of different types of modules to decrease the permeation of moisture vapor and reactive gas such as oxygen to lengthen the life span of the modules. The sealed module can be a photovoltaic module, an insulating glass unit for a window, a screen, a dynamic glazing product, a switchable window, an electrochromic window, a thin-film transistor, or other modules using items between substrates that are sealed against moisture vapor and air. The external edge seal includes a desiccated adhesive carried by a barrier film to form a tape. The seal can be placed along the edge of a sealed module or around the edge and against portions of the outer substrate surfaces of the sealed module to provide a desiccated seal that provides or lengthens the desiccated path that moisture vapor must follow before permeating the inner space of the module. The vapor barrier can be used alone or in combination with an internal edge seal. The internal seal can be desiccated or not desiccated. The internal seal can have either a low MVTR or a high MVTR.

The disclosure provides different configurations of exterior edge seals that are used to seal the perimeter of modules such as photovoltaic modules. In one exemplary configuration, the seal is provided as a moisture barrier tape (MBT) including a desiccated adhesive carried on a film. The desiccated adhesive has a breakthrough time (BTT) $\tau 10\% > 4$ hours at 85 C/100% RH 1 mm thick adhesive when tested per IEC 62788-6-2. The composition of the adhesive varies in different configurations. In one example the adhesive an olefinic polymer. In another example, the adhesive is an isobutylene-based polymer adhesive. The percentage of desiccant is varied in different configurations. The construction of the film varies in different configurations. In one example, the film can be made of a material with a low or very low moisture vapor transmission rate (MVTR). The film can be a thin foil such as a metal foil or metallized material. The film can be a plastic film, a laminated plastic film, or a plastic film or laminated plastic film with a coating such as a ceramic coating.

In one configuration, the disclosure provides a photovoltaic module with a desiccated external edge seal covering at least the outer edge of the module to seal the module from moisture in conjunction with an internal seal or as the primary seal for the module. The desiccated external edge seal also can be wrapped around the edge of the module to engage portions of the outer surfaces of its substrates to lengthen the ingress path for moisture vapor.

One configuration of the external edge seal is applied after the photovoltaic module is laminated. In this configuration, the external edge seal is applied to contact portions of the front and back surfaces and the outer edge to place the film and desiccated butyl adhesive in the path that moisture vapor must take to enter the module. This slows the intrusion of moisture. This can take the place of or supplement an internal seal located between the module substrates. In another configuration, the external edge seal is applied to the outer edge surface without wrapping over the front and back surfaces. Both configurations can be received in a protective frame.

The disclosure provides a method for manufacturing a sealed module such as a photovoltaic module wherein an assembly line is stopped to provide time for the manual or automated addition of an external edge seal to the perimeter of the module.

The disclosure provides a method of assembling sealed modules such as photovoltaic modules with an external edge seal wherein the modules continuously move along a conveyor direction. The continuous manufacturing method is a roll-to-roll process. In this process, the modules are not stopped so edges perpendicular to the conveyor direction must receive the external edge seal is a different manner. In one configuration, an external edge seal is applied around the entire perimeter of the module after the module has been cut and removed from the continuous assembly conveyor. In another configuration, the edges of the module that are parallel to the conveyor direction receive the external edge seal while the modules move along the assembly conveyor with the edges that are perpendicular to the conveyor receiving external edge seal after the modules are cut and removed from the conveyor. In a further configuration, the edges of the module that are parallel to the conveyor direction receive a sealant pumped between the substrates (internal edge seal 30) as the modules move along the assembly conveyor with the edges that are perpendicular to the conveyor receiving external edge seal after the modules are cut and removed from the conveyor.

The disclosure provides a method of increasing the useful surface area of a sealed module by decreasing the width of an internal edge seal and adding an external edge seal that adds back the sealing performance that was lost by decreasing the width of the internal edge seal. The benefit is more useful surface area while the drawback is a thicker edge. Another benefit is that, in some embodiments, the exterior edge seal can have a different composition than the internal edge seal because the exterior edge seal's function is primarily breakthrough time while the interior seal may have additional functions that must be balanced by its composition.

The individual features described below may be combined in different combinations than specifically described below to form different configurations of the device of the disclosure. The locations and the numbers of the items can be changed. The preceding non-limiting aspects of the disclosure, as well as others, are more particularly described below. A more complete understanding of the devices, assemblies, and methods can be obtained by reference to the accompanying drawings, which are not intended to indicate relative size and dimensions of the assemblies. In those drawings and the description below, like numeric designations refer to components of like function. Specific terms used in that description are intended to refer only to the particular structure of the embodiments selected for illustration in the drawings, and are not intended to define or limit the scope of the disclosure.

DETAILED DESCRIPTION OF THE DISCLOSURE

Figure 1:
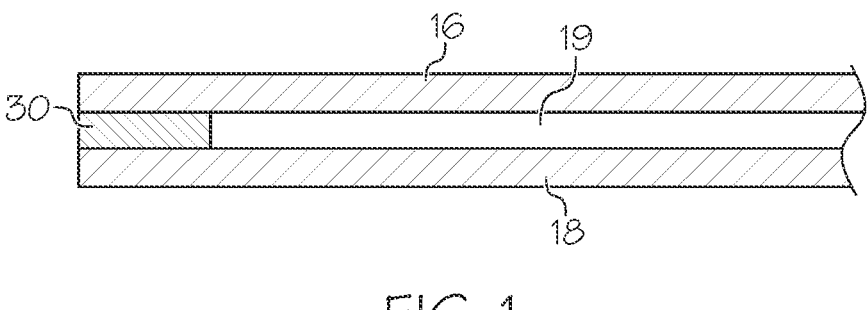
FIG. 1 is a section view of an edge of a prior art sealed module with an internal seal.
Figure 2:
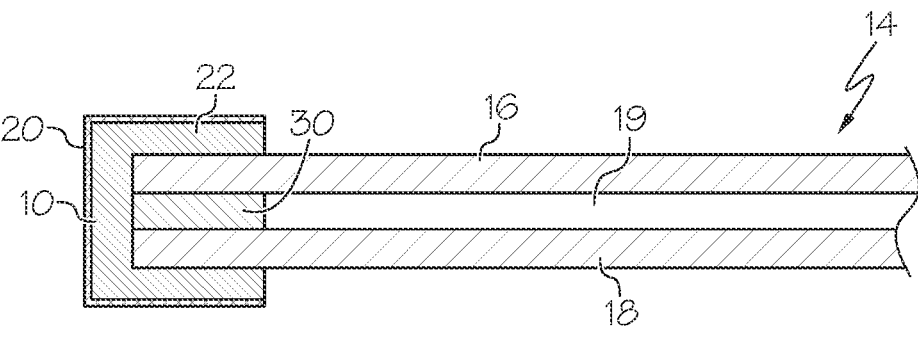
FIG. 2 is a section view of an edge of a sealed module such as a photovoltaic module showing a first configuration of an external edge seal used in conjunction with an internal seal.

This description of exemplary embodiments is intended to be read in connection with the accompanying drawings, which are to be considered part of the entire written description. The drawing figures are not necessarily to scale and certain features may be shown exaggerated in scale or in somewhat schematic form in the interest of clarity and conciseness. In the description, relative terms such as "horizontal," "vertical," "up," "down," "top" and "bottom" as well as derivatives thereof (e.g., "horizontally," "downwardly," "upwardly," etc.) should be construed to refer to the orientation as then described or as shown in the drawing figure under discussion. These relative terms are for convenience of description and normally are not intended to require a particular orientation. Terms including "inwardly" versus "outwardly," "longitudinal" versus "lateral" and the like are to be interpreted relative to one another or relative to an axis of elongation, or an axis or center of rotation, as appropriate. Terms concerning attachments, coupling and the like, such as "joined," "connected," and "interconnected," refer to a relationship wherein structures are secured or attached to one another either directly or indirectly through intervening structures, as well as both movable or rigid attachments or relationships, unless expressly described otherwise.

A first configuration of an external edge seal in the form of a moisture vapor barrier tape is indicated generally by the numeral 10 in FIGS. 2, 3, 4, 6, 8, 9, and 10. A second configuration is indicated generally by the numeral 10 in FIGS. 5 and 7. Each seal 10 is used to seal the edge of a device or module 14 against air, water, and moisture vapor intrusion. In the context of this application, a device or module includes an item 19 located between substrates 16 and 18 wherein it is desired to seal the outer edges of the substrates 16 and 18 to benefit the life span of item 19. Device or module 14 can include an internal edge seal 30 which can be a spacer (for example a flexible polymer spacer, a metal spacer, a plastic spacer), a polymer seal (for example a silicone or olefinic polymer seal), a desiccated seal, or other material used within the outer edge of module 14. Internal edge seal 30 can have a high MVTR or a low MVTR. Examples of device or module 14 include photovoltaic modules, insulating glazing units, screens, dynamic glazing units, switchable window units, electrochromic window units, and thin-film transistors.

Device or module 14 includes first 16 and second 18 substrates with item 19 located in the inner space between substrates 16 and 18. Item 19 can be a single thing or a plurality of things. Item 19 can be a material such as air or a gas such as argon. Item 19 can be an active material such as that used in a photovoltaic modules, a thin-film transistor, or a screen carried by one of substrates 16 or 18 or carried by its own carrier. Item 19 can be a component or a plurality of components. Item 19 can be encapsulated or laminated between substrates 16 and 18.

External edge seal 10 is provided in long lengths that can be rolled and cut to desired lengths or in strips that can be rolled or configured to be shipped, stored, and applied as flat strips. External edge seal 10 includes a backing barrier film 20 and a desiccated adhesive 22 carried by the barrier film. Desiccated adhesive 22 can be extruded onto backing film 20. External edge seal 10 can be extruded in a U-shaped cross section or extruded in a flat configuration that must be folded into the U-shaped configuration depicted in FIGS. 2-4. External edge seal 10 can be manufactured and stored in a flat, unfolded condition (see FIG. 7) and then folded about module 14. Notches 24 can be provided to minimize bunching of adhesive 22 when seal 10 is folded. External edge seal 10 can be extruded on demand at the location of the module manufacturing line. Also, external edge seal 10 can be manufactured in long strips wound on a storage reel. When applied, external edge seal 10 can be a single continuous piece about the perimeter (with notches corners) or applied as cut-to-length strips with sealed joints.

Backing film 20 has a low or very low MVTR. Backing film 20 can be a metal foil such as an aluminum foil. Backing film 20 can be a metalized polymer. Backing film 20 can be a polymer or a laminated polymer such as those used to make flexible photovoltaic modules. Backing film 20 can be a combination of these materials or other low MVTR films.

Desiccated adhesive 22 is a desiccated butyl adhesive that may or may not cure.

The MVTR is tested as described in ASTM F1249 which is incorporated herein by reference. A low MVTR is considered to be less than about 5, preferably no more than about 1, more preferably no more than about 0.5, and most preferably no more than about 0.3 per square meter per day for a 60 mil thick test sample when tested at 100% relative humidity at 37.8 degrees C. A very low MVTR is less than 0.3 and materials such as an aluminum foil and polymer laminate being substantially less than 0.3.

In one embodiment, the polymer used in adhesive 22 is one of or a combination of olefinic polymers that are selected from the group comprising polyisobutylene, polybutene, butyl rubber (polyisobutylene-isoprene), styrene block copolymers, especially SBS, SIS, SEBS, SEPS, SIBS, SPIBS, also in modified form, and amorphous copolymers and/or terpolymers of α-olefins (APAO).

Although isobutylene based polymers such as polyisobutylene and butyl rubber are preferred for the adhesive of seal 10 due to their low MVTR, other polymers may be used instead of or in addition to isobutylene based polymers. Isobutylene-based polymers will be defined as polymers comprising at least 80 mole percent repeat units from isobutylene. Examples of other polymers include ethylene-propylene polymer, ethylene-propylene diene polymer (EPDM), ethylene-vinyl acetate, acrylic rubber, neoprene rubber, chlorosulfonated polyethylene, urethane, epoxy, natural rubber, polymer from conjugated dienes such as synthetic polyisoprene polybutadiene, nitrile rubber, or styrene-butadiene rubber, and amorphous polyolefins (e.g., homopolymer or copolymer of propene along with other monoolefins or diolefins having from 2 to 10 carbon atoms and having less than 20 wt. % crystallinity as polymers and being other than EPDM and ethylene-propylene polymer). Polyisobutylenes desirably have a number average molecular weight of about 2,000 to 1,400,000 or more, and more desirably from 10,000 to 800,000. The polyisobutylenes are desirably polymers of essentially isobutylene with initiator fragments and/or chain transfer or chain terminator fragments. Butyl rubber is a polymer comprising from about 80 to about 98 or 99 wt. % isobutylene and from about 1 to about 20 wt. % of other monomers such as dienes with from 4 to 12 carbon atoms (e.g., isoprene), and/or aromatic vinyl monomers with from 8 to 16 carbon atoms such as styrene, para-methylstyrene, etc. If para-methylstyrene is a comonomer, desirably the polymer is halogenated (e.g., brominated). Butyl rubber desirably has a number average molecular weight from about 250,000 to about 600,000, more desirably from about 350,000 to about 450,000. The other polymers desirably have number average molecular weights from about 10,000 to 1,000,000 or 2,000,000. Amorphous polyalphaolefins desirably have a number average molecular weight from about 10,000 to about 40,000, more desirably from about 10,000 to about 25,000. If butyl rubber is present in the core, it is desirably from about 5 to about 70 wt. % of the polymers of the core. Amorphous polyalphaolefins are often used in combination with polyisobutylene and/or butyl rubber. The weight ratio of amorphous polyalphaolefins to polyisobutylene and/or butyl rubber is desirably from 1:8 to 8:1 and more desirably from 1:4 to 4:1.

The desiccant material generally increases the time for moisture to penetrate adhesive layer 22 and reach item 19 such as the photovoltaic layer. The desiccant can be provided in 2 weight percent to 80 weight percent by weight with the adhesive. The desiccant material is preferably a zeolite molecular sieve, at a concentration of 10 weight percent to 50 weight percent and more preferably from 10 weight percent to less than 20 weight percent (wt. %). Other desiccants can be used in combination with or in place of the zeolite molecular sieve. These can be calcium oxide, silica gel or other moisture scavengers. The desiccant material acts to increase the time lag until steady state moisture vapor transmission through the sealant occurs by adsorbing moisture into the zeolite cage structure and preventing any moisture from penetrating into material 19 such as into the laminating adhesive film and photovoltaic layer until all the desiccant material in adhesive 22 has been fully or near fully saturated. In the example of a photovoltaic panel, by preventing moisture from entering into the photovoltaic layer from an edge of the panel, the durability and/or lifetime of the panel and/or the photovoltaic layer is increased. The phrases "desiccated sealant" and "desiccated adhesive", as used herein, means any sealant or adhesive sealant material and desiccant material described herein along with any and all equivalents of the sealant material, desiccant material and/or combination of sealant material and/or desiccant material.

IEC 62788-6-2:2020 from the International Electrotechnical Commission provides methods for measuring the steady-state water vapour transmission rate (WVTR), water vapour permeability (P), diffusivity (D), solubility(S), and moisture breakthrough time ($\tau$10) (defined as the time to reach 10% of the steady state WVTR) for polymeric materials such as encapsulants, edge seals, frontsheets and backsheets. When tested by this method, one configuration of the desiccated adhesive 22 has a moisture breakthrough time $\tau$10 that is greater than four hours at 85 degrees C./100% relative humidity (RH) when tested at 1 mm thickness. A second configuration of the desiccated adhesive 22 has a moisture breakthrough time $\tau$10 that is greater than eighteen hours at 85 degrees C./100% relative humidity (RH) when tested at 1 mm thickness. A third configuration of the desiccated adhesive 22 has a moisture breakthrough time $\tau$10 that is greater than thirty hours at 85 degrees C./100% relative humidity (RH) when tested at 1 mm thickness.

An exemplary desiccated adhesive 22 can include the following components measure by percent weight: 30 to 70 percent olefinic polymers, 0 to 10 percent modified polymer, 5 to 50 percent fine particle inert filler, 2 to 80 percent water binding substances, 0 to 4 percent aging resistors, 0 to 4 percent adhesion promoter/coupling agent, 0 to 30 percent plasticizer viscosity modifier—MW 100-1000, and 0 to 35 percent tackifier resin—MW 500-3000. The modified polymer is disclosed in U.S. Pat. No. 8,372,909 which is incorporated by reference.

Figure 10:
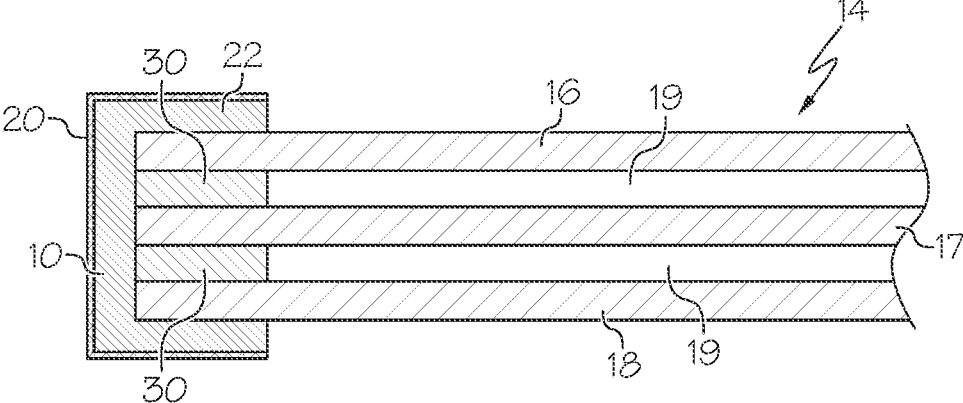
FIG. 10 is a section view of an edge of an insulating glass module showing the first configuration of an external edge seal used in conjunction with internal seals in a module with three substrates.

In FIGS. 2, 4, 5, 7, and 10, an internal edge seal 30 is positioned between substrates 16 and 18. FIG. 10 uses two internal edge seals 30 and an inner substrate 17 such as the structure in a triple glazing unit. Internal edge seal 30 can be a desiccated butyl seal applied as a strip or pumped into position. Internal edge seal 30 also can be a physical spacer or a material protecting the edge of material 19. Internal edge seal 30 can be permeable to moisture vapor such as a silicone. In the arrangement of FIG. 1, external edge seal 10 is wrapped about the outer perimeter edge of module 14. Seal 10 has outer legs that extend over portions of the front and back surfaces (the outer surfaces) of substrates 16 and 18. Seal 10 also covers the outer edges of substrates 16 and 18. When the outer legs of seal 10 extends the same width as internal edge seal 30, seal 10 at least doubles the length of the path that moisture must travel before entering module 14. For example, in a case where internal edge seal 30 has a 5 mm width (left to right dimension in FIG. 2), the legs of external edge seal 10 also extend 5 mm over the front and back (the outer) surfaces of substrates 16 and 18. The path to breach the interior of module is thus increased to 10 mm by using external edge seal 10 in addition to the thicknesses of the thinner substrate 16 or 18. Film 20 prevents moisture from entering adhesive 22 for any locations other than the uncovered adhesive edges.

Figure 4:
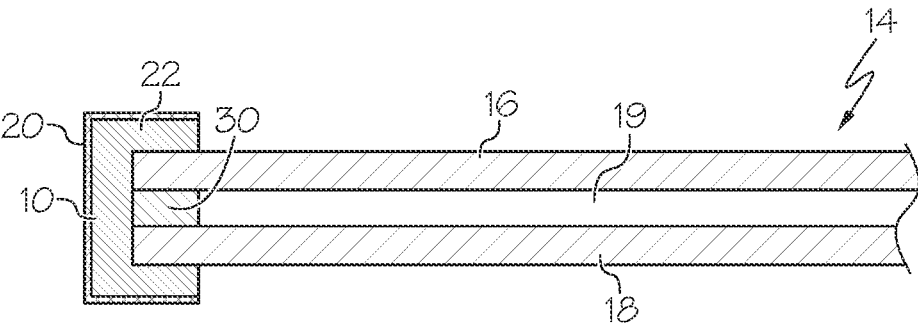
FIG. 4 is a section view of an edge of a sealed module such as a photovoltaic module showing the first configuration of an external edge seal used with an internal seal wherein the internal seal and outer legs of the external edge seal are shorter than in the FIG. 1 configuration to provide about the same length of desiccated path.

In the FIG. 4 configuration, the useful area of module 14 is increased. FIG. 14 depicts a configuration wherein the width of internal edge seal 30 is halved (such as to 2.5 mm in the above example) and the length of the desiccated path is maintained by adding 2.5 mm wide legs of desiccated adhesive on the outer surfaces of substrates 16 and 18 to provide a total path length of at least 5 mm while providing additional useful area for items 19.

Figure 3:
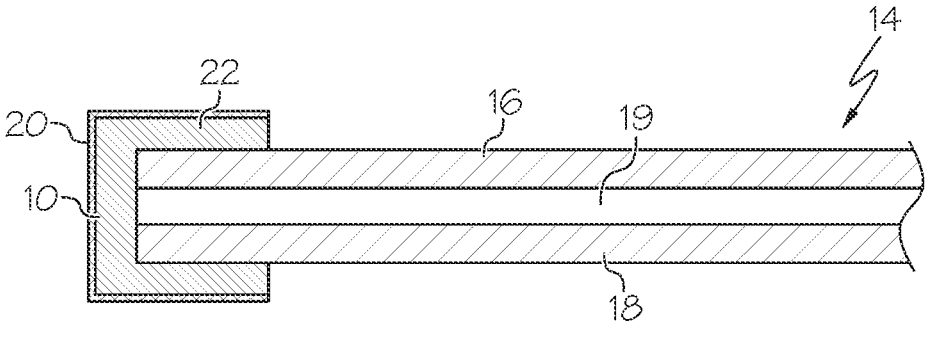
FIG. 3 is a section view of an edge of a sealed module such as a photovoltaic module showing the first configuration of an external edge seal used without an internal seal.
Figure 6:
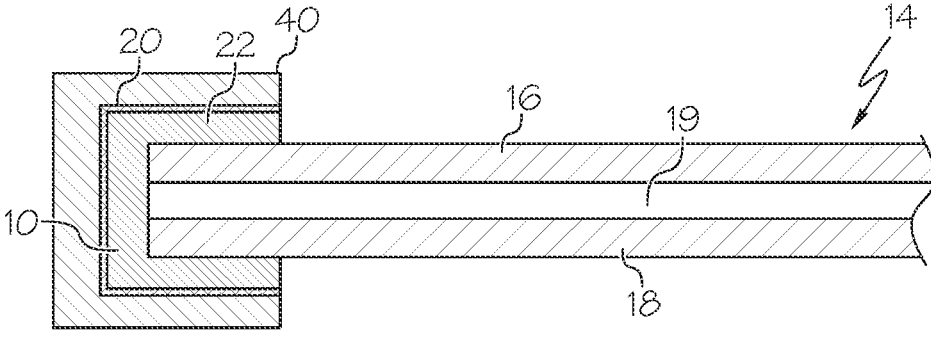
FIG. 6 is a section view of an edge of a photovoltaic module showing the first configuration of an external edge seal in a frame and used without an internal seal.
Figure 8:
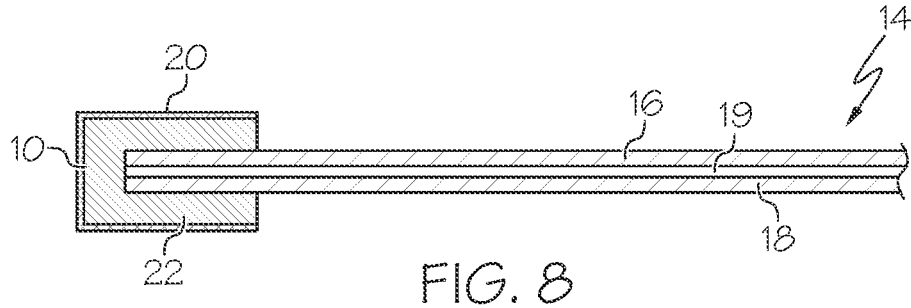
FIG. 8 is a section view of an edge of a flexible photovoltaic module with the first configuration of the external edge seal without an internal seal.
Figure 9:
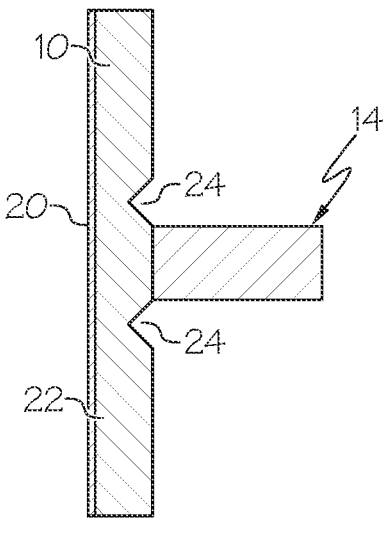
FIG. 9 is a section view of an embodiment of the first configuration of the external edge seal with defined notches that help it be folded around the edge of the module.

FIGS. 3, 6, and 8 show examples of external edge seal 10 being used to provide the entire desiccated edge seal for module 14 because internal edge seal 30 is not used. Module 14 of FIG. 6 is a thin flexible photovoltaic module.

Figure 5:
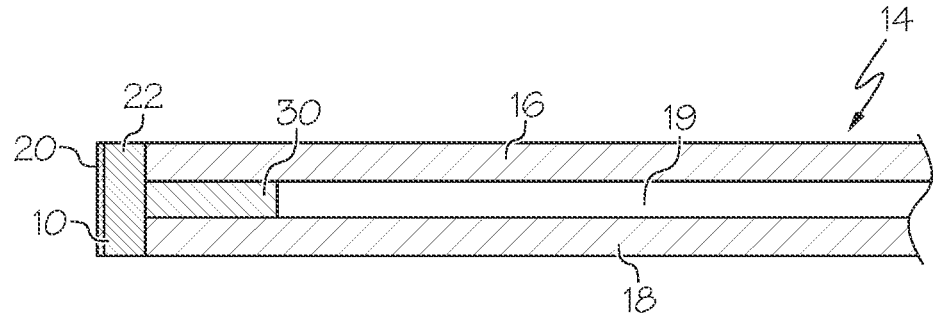
FIG. 5 is a section view of an edge of a photovoltaic module showing a second configuration of an external edge seal application used in conjunction with an internal seal.
Figure 7:
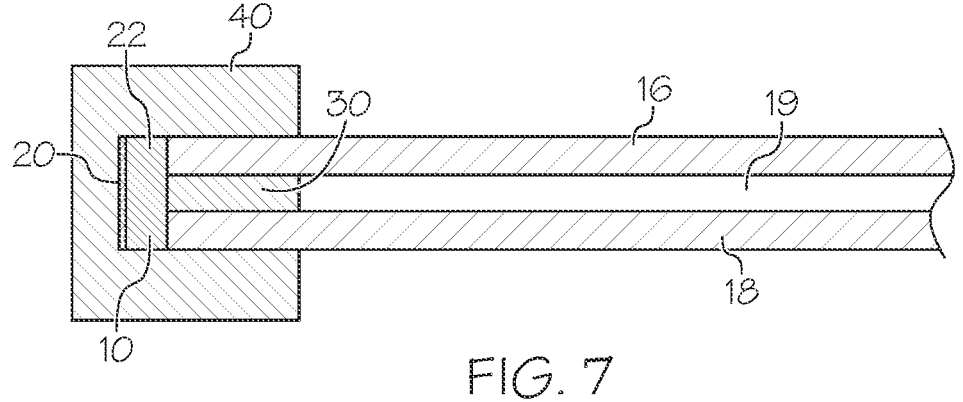
FIG. 7 is a section view of an edge of a photovoltaic module showing a frame that carries the second configuration of an external edge seal applied.

In the arrangement of FIGS. 5 and 7, external edge seal 10 is applied just to the outer edge of module 14 and does not wrap over the front or back surfaces of substrates 16 and 18. This arrangement increases the moisture path by only the thickness of the thinner of substrates 16 and 18. This configuration can be useful for an arrangement when module 14 is being fit into a frame 40 as shown in FIG. 7.

FIGS. 6 and 7 show arrangements with frames 40 used with external edge seal 10. In both arrangements, frames 40 can be installed over external edge seal 10 or external edge seal 10 can be carried inside frame 40 with frame 40 and external edge seal 10 being applied as a unit.

External edge seal 10 can be added to modules with internal edge seals 30 after such modules are manufactured. External edge seal 10 can be used to provide an edge seal to module 14 when the manufacturing process of module 14 does not provide for the application of a full perimeter internal edge seal 30. When modules 14 are produced in a continuous, non-stop moving process, and internal edge seal 30 is not added to modules 14, external edge seal 10 can be installed after modules 14 are cut and removed from the manufacturing line. This removes the edge sealing process from the main module manufacturing line and moves it downstream to another work station. In another configuration, the edges of module 14 that are parallel to the conveyor direction receive sections of external edge seal 10 while modules 14 move along the assembly conveyor with the edges that are perpendicular to the conveyor receiving external edge seal 10 after modules 14 are cut and removed from the conveyor. In a further configuration, the edges of module 14 that are parallel to the conveyor direction receive a sealant pumped between the substrates 16 and 18 to form internal edge seal 30 along the machine direction edges as modules 14 move along the assembly conveyor with the edges that are perpendicular to the conveyor receiving external edge seal 10 after modules 14 are cut and removed from the conveyor. As noted above, external edge seal 10 can be manufactured on demand at the site of the manufacturing line. Lamination and sealing of the external edge seal 10 to module 14 can occur by various techniques such as a nip roll or a solar laminator.

In the foregoing description, certain terms have been used for brevity, clearness, and understanding. No unnecessary limitations are to be implied therefrom beyond the requirement of the prior art because such terms are used for descriptive purposes and are intended to be broadly construed. Moreover, the description and illustration of the invention is an example and the invention is not limited to the exact details shown or described. Modifications and alterations of those embodiments will be apparent to one who reads and understands this general description. The present disclosure should be construed as including all such modifications and alterations insofar as they come within the scope of the appended claims or equivalents thereof. Throughout the description and claims of this specification the words "comprise" and "include" as well as variations of those words, such as "comprises," "includes," "comprising," and "including" are not intended to exclude additives, components, integers, or steps.

The invention claimed is:

1. A sealed module comprising:
a first substrate having an outer surface and an outer perimeter edge;
a second substrate having an outer surface and an outer perimeter edge;
a photovoltaic material between the first and second substrates;
the first substrate being spaced from the second substrate;
an external edge seal having a barrier film and a desiccated adhesive carried by the barrier film; the barrier film having a very low MVTR;
the desiccated adhesive of the external edge seal extending around edge portions of the first and second substrates with the desiccated adhesive in contact with the outer surface of the first substrate, the outer perimeter edge of the first substrate, the outer perimeter edge of the second substrate, and the outer surface of the second substrate, wherein the desiccated adhesive extends continuously from the outer surface of the first substrate to the outer surface of the second substrate; and
the desiccated adhesive of the external edge seal increasing the time for moisture to penetrate the module and reach the photovoltaic material.

2. The module of claim 1, further comprising an internal edge seal between the first and second substrates; the desiccated adhesive being in contact with the internal edge seal.

3. The module of claim 2, wherein the internal edge seal is desiccated.

4. The module of claim 1, wherein desiccated adhesive includes an isobutylene-based polymer and a desiccant at a concentration of less than 20 weight percent.

5. The module of claim 4, wherein the desiccant is a zeolite molecular sieve.

* * * * *